United States Patent
Choi et al.

(10) Patent No.: US 10,643,926 B2
(45) Date of Patent: May 5, 2020

(54) SEMICONDUCTOR DEVICE HAVING A STRUCTURE FOR INSULATING LAYER UNDER METAL LINE

(71) Applicant: Samsung Electronics Co., Ltd., Suwon-si, Gyeonggi-do (KR)

(72) Inventors: Min Jun Choi, Hwasung-si (KR); Doo Won Kwon, Hwasung-si (KR); Kwan Sik Kim, Hwasung-si (KR); Tae Young Song, Hwasung-si (KR); Sung Hyun Yoon, Hwasung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/033,620

(22) Filed: Jul. 12, 2018

(65) Prior Publication Data

US 2019/0198426 A1    Jun. 27, 2019

(30) Foreign Application Priority Data

Dec. 22, 2017   (KR) .................. 10-2017-0178361

(51) Int. Cl.
| | | |
|---|---|---|
| *H01L 23/48* | (2006.01) | |
| *H01L 23/532* | (2006.01) | |
| *H01L 31/02* | (2006.01) | |
| *H01L 21/321* | (2006.01) | |
| *H01L 21/768* | (2006.01) | |
| *H01L 27/146* | (2006.01) | |

(52) U.S. Cl.
CPC ........ *H01L 23/481* (2013.01); *H01L 21/3212* (2013.01); *H01L 21/76831* (2013.01); *H01L 21/76898* (2013.01); *H01L 23/5329* (2013.01); *H01L 27/14636* (2013.01); *H01L 31/02005* (2013.01)

(58) Field of Classification Search
CPC ............. H01L 23/481; H01L 21/76829; H01L 21/76897; H01L 27/146
USPC .................................................. 257/774, 758
See application file for complete search history.

(56) References Cited

U.S. PATENT DOCUMENTS

| | | | |
|---|---|---|---|
| 6,537,875 B2 | 3/2003 | Won et al. | |
| 6,541,863 B1* | 4/2003 | Horstmann | ......... H01L 21/7682 257/614 |
| 7,049,648 B2 | 5/2006 | Won et al. | |
| 2003/0011070 A1* | 1/2003 | Iijima | ................. H01L 21/4857 257/734 |
| 2005/0009210 A1* | 1/2005 | Hosotani | ................ B82Y 10/00 438/3 |
| 2006/0211235 A1* | 9/2006 | Usami | ................. H01L 21/7682 438/618 |

(Continued)

FOREIGN PATENT DOCUMENTS

| | | |
|---|---|---|
| KR | 20020021489 A | 3/2002 |
| KR | 20050033110 A | 4/2005 |
| KR | 20140063271 A | 5/2014 |

*Primary Examiner* — Nitin Parekh
(74) *Attorney, Agent, or Firm* — Harness, Dickey & Pierce, P.L.C.

(57) ABSTRACT

A semiconductor device including a via plug formed on a substrate and a metal layer for interconnection formed at an end of the via plug, wherein an insulating structure is under the metal layer for interconnection and the insulating structure has a different layered structure according to a positional relationship with the metal layer for interconnection is disclosed.

20 Claims, 11 Drawing Sheets

(56) References Cited

U.S. PATENT DOCUMENTS

| | | | |
|---|---|---|---|
| 2008/0197496 A1* | 8/2008 | Mori | H01L 21/76843 257/751 |
| 2010/0059887 A1* | 3/2010 | Ueki | H01L 21/02126 257/741 |
| 2011/0237070 A1* | 9/2011 | Yonekura | H01L 21/0332 438/653 |
| 2014/0061924 A1* | 3/2014 | Chen | H01L 27/0617 257/758 |
| 2014/0141569 A1 | 5/2014 | Jo et al. | |
| 2015/0228586 A1* | 8/2015 | Usami | H01L 21/76832 257/751 |
| 2016/0079205 A1 | 3/2016 | Lin et al. | |
| 2016/0086880 A1 | 3/2016 | Kalandar et al. | |
| 2016/0086926 A1 | 3/2016 | Pratt et al. | |
| 2016/0086931 A1 | 3/2016 | Jang et al. | |
| 2016/0093518 A1 | 3/2016 | Jung et al. | |
| 2016/0093555 A1 | 3/2016 | Takeda et al. | |
| 2016/0093583 A1 | 3/2016 | Yu et al. | |
| 2016/0095221 A1 | 3/2016 | Ramachandran et al. | |
| 2016/0099196 A1 | 4/2016 | Yu et al. | |
| 2016/0099201 A1 | 4/2016 | Choi et al. | |
| 2016/0109579 A1 | 4/2016 | Madrid | |
| 2016/0111351 A1 | 4/2016 | Ma et al. | |
| 2016/0116672 A1 | 4/2016 | Leobandung | |
| 2016/0118318 A1 | 4/2016 | Yang et al. | |
| 2016/0126148 A1 | 5/2016 | Mauer et al. | |
| 2016/0133312 A1 | 5/2016 | Lee et al. | |
| 2016/0133518 A1 | 5/2016 | Kuo et al. | |
| 2016/0141226 A1 | 5/2016 | Leobandung | |
| 2016/0141228 A1 | 5/2016 | Leobandung | |
| 2016/0148840 A1 | 5/2016 | Subramanian et al. | |
| 2016/0148863 A1 | 5/2016 | Chen et al. | |
| 2016/0148888 A1 | 5/2016 | Ryu et al. | |
| 2016/0155686 A1 | 6/2016 | Lee et al. | |
| 2016/0163596 A1 | 6/2016 | Zimmerman et al. | |
| 2016/0167358 A1 | 6/2016 | Tang et al. | |
| 2016/0168737 A1 | 6/2016 | Wang et al. | |
| 2016/0172242 A1 | 6/2016 | Wirz et al. | |
| 2016/0181196 A1 | 6/2016 | Lee et al. | |
| 2016/0190007 A1 | 6/2016 | Wang et al. | |
| 2016/0190041 A1 | 6/2016 | Gong et al. | |
| 2016/0197065 A1 | 7/2016 | Guzek et al. | |
| 2016/0204035 A1 | 7/2016 | Huang et al. | |
| 2016/0204084 A1 | 7/2016 | Lin | |
| 2016/0183391 A1 | 8/2016 | Kunard et al. | |
| 2016/0221038 A1 | 8/2016 | Johnson et al. | |
| 2016/0225668 A1 | 8/2016 | Lin et al. | |
| 2016/0225695 A1 | 8/2016 | Gandhi et al. | |
| 2016/0232838 A1 | 8/2016 | Seo | |
| 2016/0233136 A1 | 8/2016 | Hargan et al. | |
| 2016/0233160 A1 | 8/2016 | Kirby et al. | |
| 2016/0233190 A1 | 8/2016 | Bernier et al. | |
| 2016/0239461 A1 | 8/2016 | Kavipurapu | |
| 2016/0239768 A1 | 8/2016 | Jones | |
| 2016/0250245 A1 | 9/2016 | Lotteau et al. | |
| 2016/0252570 A1 | 9/2016 | Whetsel | |
| 2016/0258996 A1 | 9/2016 | Lim et al. | |
| 2016/0260674 A1 | 9/2016 | Jones et al. | |
| 2016/0264402 A1 | 9/2016 | Yu et al. | |
| 2016/0266061 A1 | 9/2016 | Yu et al. | |
| 2016/0267946 A1 | 9/2016 | Ahn et al. | |
| 2016/0268230 A1 | 9/2016 | Lin et al. | |
| 2016/0268235 A1 | 9/2016 | Chandolu | |
| 2016/0268246 A1 | 9/2016 | Quaglietta et al. | |
| 2016/0271611 A1 | 9/2016 | Lee et al. | |
| 2016/0276310 A1 | 9/2016 | Rajoo et al. | |
| 2016/0276314 A1 | 9/2016 | Ching et al. | |
| 2016/0276370 A1* | 9/2016 | Miyairi | H01L 21/8258 |
| 2016/0282259 A1 | 9/2016 | Kolb et al. | |
| 2016/0282411 A1 | 9/2016 | Whetsel et al. | |
| 2016/0284384 A1 | 9/2016 | Kim | |
| 2016/0284629 A1 | 9/2016 | Shea | |
| 2016/0285418 A1 | 9/2016 | Jones et al. | |
| 2016/0293573 A1 | 10/2016 | Guo et al. | |
| 2016/0293579 A1 | 10/2016 | England et al. | |
| 2016/0305983 A1 | 10/2016 | Seo et al. | |
| 2016/0307823 A1 | 10/2016 | Fang et al. | |
| 2016/0307835 A1 | 10/2016 | Chang | |
| 2016/0307869 A1 | 10/2016 | Faruqui et al. | |
| 2016/0307870 A1 | 10/2016 | Kelly et al. | |
| 2016/0307957 A1 | 10/2016 | Tharumalingam | |
| 2016/0309098 A1 | 10/2016 | Montandon et al. | |
| 2016/0313514 A1 | 10/2016 | Ma et al. | |
| 2016/0314232 A1 | 10/2016 | Larzul | |
| 2016/0314965 A1 | 10/2016 | Nguyen et al. | |
| 2016/0318757 A1 | 11/2016 | Chou et al. | |
| 2016/0322340 A1 | 11/2016 | Li et al. | |
| 2016/0322344 A1 | 11/2016 | Raorane et al. | |
| 2016/0324443 A1 | 11/2016 | Rowland et al. | |
| 2016/0326371 A1 | 11/2016 | Seo et al. | |
| 2016/0327591 A1 | 11/2016 | Hung | |
| 2016/0329229 A1 | 11/2016 | Sun et al. | |
| 2016/0336179 A1 | 11/2016 | Mizutani et al. | |
| 2016/0340557 A1 | 11/2016 | Bai et al. | |
| 2016/0343613 A1 | 11/2016 | Uzoh | |
| 2016/0343629 A1 | 11/2016 | Rajoo et al. | |
| 2016/0343696 A1 | 11/2016 | Reber et al. | |
| 2016/0350181 A1 | 12/2016 | Cha et al. | |
| 2016/0351472 A1 | 12/2016 | Park et al. | |
| 2016/0355940 A1 | 12/2016 | Chen et al. | |
| 2016/0357630 A1 | 12/2016 | Kang et al. | |
| 2016/0358818 A1 | 12/2016 | Kuo et al. | |
| 2016/0358865 A1 | 12/2016 | Shih et al. | |
| 2016/0363609 A1 | 12/2016 | Wygant et al. | |
| 2016/0364309 A1 | 12/2016 | Park et al. | |
| 2016/0364500 A1 | 12/2016 | Bishop et al. | |
| 2016/0365136 A1 | 12/2016 | Ware | |
| 2016/0365334 A1 | 12/2016 | Shih et al. | |
| 2016/0372425 A1 | 12/2016 | Liu et al. | |
| 2016/0372448 A1 | 12/2016 | Yazdani | |
| 2016/0373629 A1 | 12/2016 | Jung et al. | |
| 2016/0379818 A1 | 12/2016 | Collins et al. | |
| 2016/0379876 A1 | 12/2016 | Farooq et al. | |
| 2016/0379935 A1 | 12/2016 | Shih | |
| 2016/0381319 A1 | 12/2016 | Nakajima et al. | |
| 2017/0003340 A1 | 1/2017 | Chakrabarty et al. | |
| 2017/0005000 A1 | 1/2017 | Beyne | |
| 2017/0005054 A1 | 1/2017 | Chiu et al. | |
| 2017/0005128 A1 | 1/2017 | Sasaki | |
| 2017/0011810 A1 | 1/2017 | Tran et al. | |
| 2017/0011993 A1 | 1/2017 | Zhao et al. | |
| 2017/0012029 A1 | 1/2017 | Lambert et al. | |
| 2017/0017744 A1 | 1/2017 | Swaminathan et al. | |
| 2017/0018450 A1 | 1/2017 | Tang | |
| 2017/0018509 A1 | 1/2017 | Puri et al. | |
| 2017/0018530 A1 | 1/2017 | Cheah et al. | |
| 2017/0022049 A1 | 1/2017 | Chu et al. | |
| 2017/0023405 A1 | 1/2017 | Fahim et al. | |
| 2017/0023682 A1 | 1/2017 | Liu et al. | |
| 2017/0025384 A1 | 1/2017 | Park et al. | |
| 2017/0026598 A1 | 1/2017 | Fahim et al. | |
| 2017/0033061 A1 | 2/2017 | Rabie et al. | |
| 2017/0040290 A1 | 2/2017 | Lin et al. | |
| 2017/0040296 A1 | 2/2017 | Das et al. | |
| 2017/0040373 A1 | 2/2017 | Kim et al. | |
| 2017/0050217 A1 | 2/2017 | Johnson et al. | |
| 2017/0053872 A1 | 2/2017 | Lee et al. | |
| 2017/0053899 A1 | 2/2017 | Bartley et al. | |
| 2017/0059648 A1 | 3/2017 | Woo et al. | |
| 2017/0069594 A1 | 3/2017 | Pan et al. | |
| 2017/0069598 A1 | 3/2017 | Nelson et al. | |
| 2017/0069601 A1 | 3/2017 | Park | |
| 2017/0077051 A1 | 3/2017 | Sanders et al. | |
| 2017/0081174 A1 | 3/2017 | Liu et al. | |
| 2017/0084488 A1 | 3/2017 | Hung et al. | |
| 2017/0084489 A1 | 3/2017 | Lin et al. | |
| 2017/0084525 A1 | 3/2017 | Hung et al. | |
| 2017/0084583 A1 | 3/2017 | Lin et al. | |
| 2017/0091027 A1 | 3/2017 | Sohn et al. | |
| 2017/0092566 A1 | 3/2017 | Biederman et al. | |
| 2017/0092626 A1 | 3/2017 | Yuan et al. | |
| 2017/0098469 A1 | 4/2017 | Park | |
| 2017/0098509 A1 | 4/2017 | Gupta et al. | |

(56) References Cited

U.S. PATENT DOCUMENTS

| | | |
|---|---|---|
| 2017/0098599 A1 | 4/2017 | Zhou et al. |
| 2017/0102428 A1 | 4/2017 | Erickson |
| 2017/0103901 A1 | 4/2017 | Shen et al. |
| 2017/0103931 A1 | 4/2017 | Whetsel |
| 2017/0103954 A1 | 4/2017 | Wu et al. |
| 2017/0109063 A1 | 4/2017 | Lee et al. |
| 2017/0110406 A1 | 4/2017 | Yang et al. |
| 2017/0110419 A1 | 4/2017 | Shih et al. |
| 2017/0110420 A1 | 4/2017 | Cheng et al. |
| 2017/0115338 A1 | 4/2017 | Chadalavda et al. |
| 2017/0125341 A1 | 5/2017 | Lin et al. |
| 2017/0125351 A1 | 5/2017 | Kulkarni et al. |
| 2017/0125364 A1 | 5/2017 | Cho et al. |
| 2017/0125383 A1 | 5/2017 | Liu |
| 2017/0125387 A1 | 5/2017 | Kang et al. |
| 2017/0126323 A1 | 5/2017 | Gudeman |
| 2017/0133281 A1 | 5/2017 | Richter et al. |
| 2017/0133359 A1 | 5/2017 | Mei et al. |
| 2017/0139050 A1 | 5/2017 | Curran et al. |
| 2017/0139132 A1 | 5/2017 | Patel et al. |
| 2017/0141079 A1 | 5/2017 | Kao et al. |
| 2017/0141183 A1 | 5/2017 | Kim |
| 2017/0148715 A1 | 5/2017 | Wu et al. |
| 2017/0154148 A1 | 6/2017 | Barowski et al. |
| 2017/0154655 A1 | 6/2017 | Seo |
| 2017/0154666 A1 | 6/2017 | Park |
| 2017/0154876 A1 | 6/2017 | Li et al. |
| 2017/0155004 A1 | 6/2017 | Phoa et al. |
| 2017/0158500 A1 | 6/2017 | Chang et al. |
| 2017/0162252 A1 | 6/2017 | Ware et al. |
| 2017/0162508 A1 | 6/2017 | Farooq et al. |
| 2017/0162528 A1 | 6/2017 | Umemoto |
| 2017/0162544 A1 | 6/2017 | Kwak et al. |
| 2017/0166784 A1 | 6/2017 | Hedrick et al. |
| 2017/0170016 A1 | 6/2017 | Lee et al. |
| 2017/0179001 A1 | 6/2017 | Brunschwiler et al. |
| 2017/0179029 A1 | 6/2017 | Enquist et al. |
| 2017/0179030 A1 | 6/2017 | Tseng et al. |
| 2017/0179056 A1 | 6/2017 | Schrems et al. |
| 2017/0184459 A1 | 6/2017 | Liu et al. |
| 2017/0186669 A1 | 6/2017 | Klewer |
| 2017/0186693 A1 | 6/2017 | Stamper et al. |
| 2017/0186720 A1 | 6/2017 | Fathi et al. |
| 2017/0186731 A1 | 6/2017 | Koike |
| 2017/0186732 A1 | 6/2017 | Chu et al. |
| 2017/0186734 A1 | 6/2017 | Kim |
| 2017/0194248 A1 | 7/2017 | Das |
| 2017/0194265 A1 | 7/2017 | Shapiro et al. |
| 2017/0194291 A1 | 7/2017 | Yu et al. |
| 2017/0194295 A1 | 7/2017 | Chang et al. |
| 2017/0194373 A1 | 7/2017 | Woychik et al. |
| 2017/0200507 A1 | 7/2017 | Jeong et al. |
| 2017/0200615 A1 | 7/2017 | Rantala et al. |
| 2017/0200620 A1 | 7/2017 | Collins et al. |
| 2017/0200698 A1 | 7/2017 | Graf et al. |
| 2017/0201662 A1 | 7/2017 | Kim et al. |
| 2017/0205473 A1 | 7/2017 | Deak et al. |
| 2017/0207154 A1 | 7/2017 | Lee et al. |
| 2017/0207158 A1 | 7/2017 | Kang et al. |
| 2017/0213922 A1 | 7/2017 | Lucow et al. |

\* cited by examiner

US 10,643,926 B2

1

SEMICONDUCTOR DEVICE HAVING A STRUCTURE FOR INSULATING LAYER UNDER METAL LINE

CROSS-REFERENCE TO RELATED APPLICATION

This U.S. non-provisional patent application claims priority under 35 U.S.C. § 119 to and the benefit of Korean Patent Application No. 10-2017-0178361, filed on Dec. 22, 2017, in the Korean Intellectual Property Office (KIPO), the disclosure of which is incorporated herein by reference in its entirety.

BACKGROUND

Inventive concepts relate to a semiconductor device having a structure in which an insulating layer is formed under a metal interconnection, the metal interconnection formed on a via plug structure.

A 3-dimensional (3D) package technique in which a plurality of semiconductor chips are mounted in one package such as a multi-chip stacked package or a system in package is used.

A via plug structure vertically passing through a substrate (e.g. a die) is applied to implement a high-density, low-power, and high-speed thin-film 3D package.

SUMMARY

Some example embodiments are directed to providing a semiconductor device having a structure in which an insulating layer is formed under an interconnection on a via plug structure for improving electrical characteristics and reliability of the semiconductor device.

A semiconductor device according to some example embodiments includes comprising a via plug on a substrate, and a metal layer at an end of the via plug, the metal layer connected to an interconnection layer. An insulating structure is under the metal layer, and the insulating structure has a different layered structure according to a positional relationship with the metal layer.

A semiconductor device according to some example embodiments includes semiconductor structure, a via plug formed to pass through at least partially the semiconductor structure, and a metal layer at an end of the via plug. A bottom surface adjacent to a side surface of the metal layer has a different depth according to a distance from the side surface.

A semiconductor device according to some example embodiments includes a substrate on which a photodiode is formed, an insulating layer on the substrate, a via plug passing through at least a portion of the substrate, and a metal layer formed on the via plug. An insulating structure comprising one or more layered structures is under the metal layer for interconnection.

BRIEF DESCRIPTION OF THE DRAWINGS

The above and other objects, features and advantages of example embodiments will become more apparent to those of ordinary skill in the art by describing example embodiments thereof in detail with reference to the accompanying drawings, in which.

2

Figure 1:
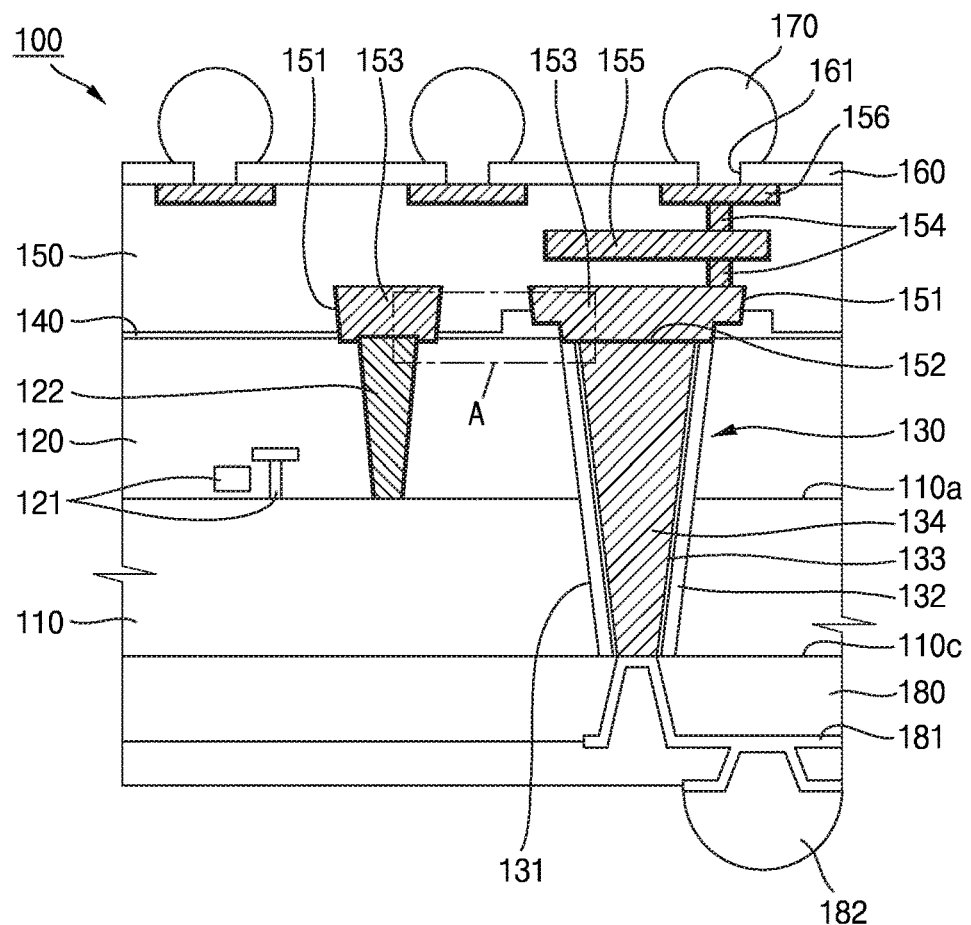
FIG. 1 is a cross-sectional view of a semiconductor device according to some example embodiments.
Figure 2:
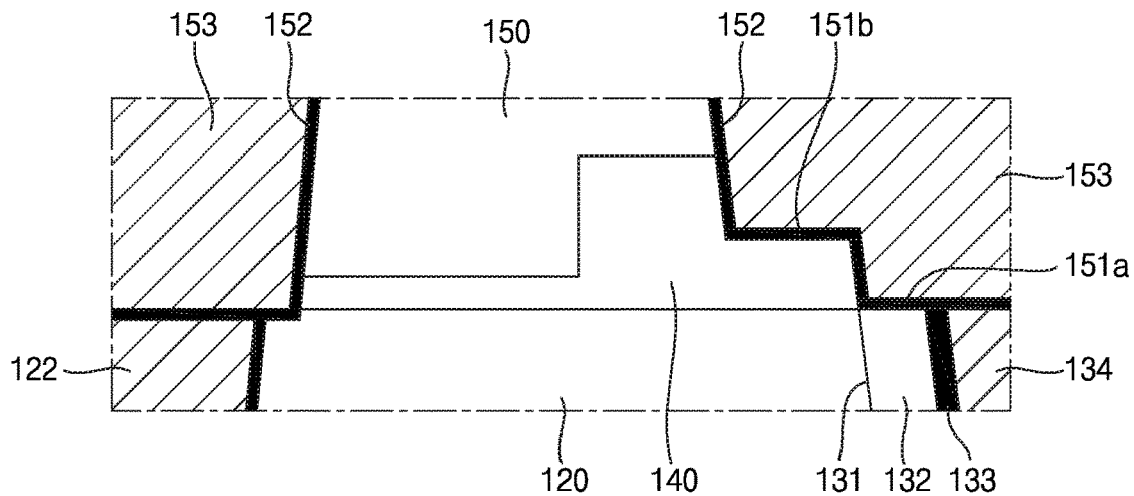
Figure 12:
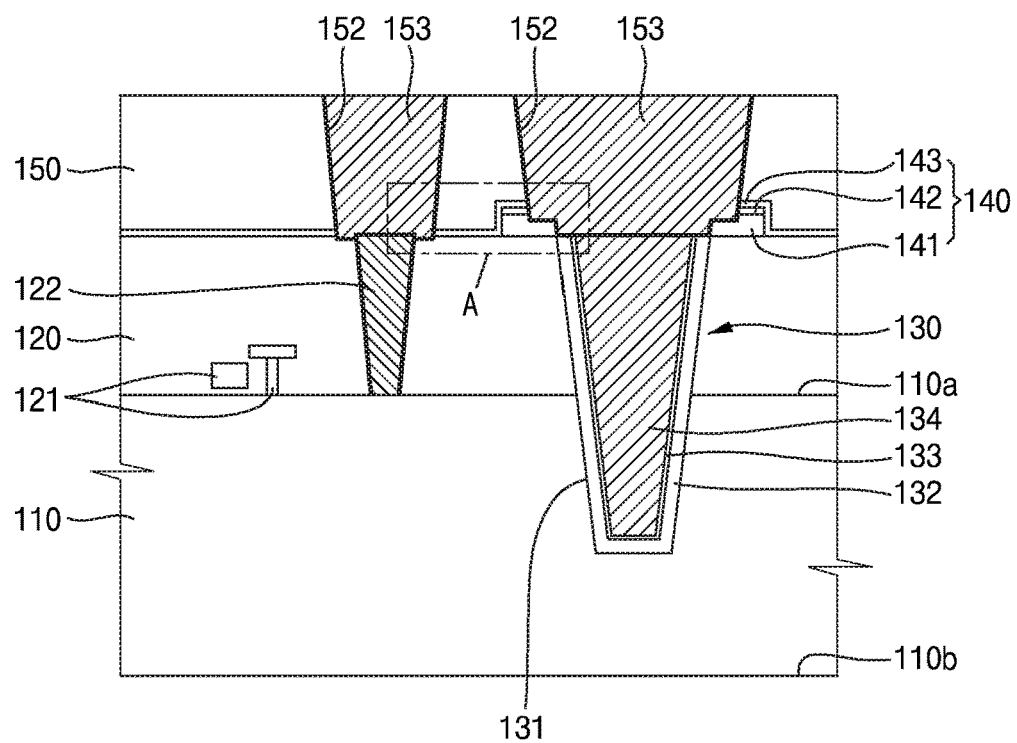
Figure 13:
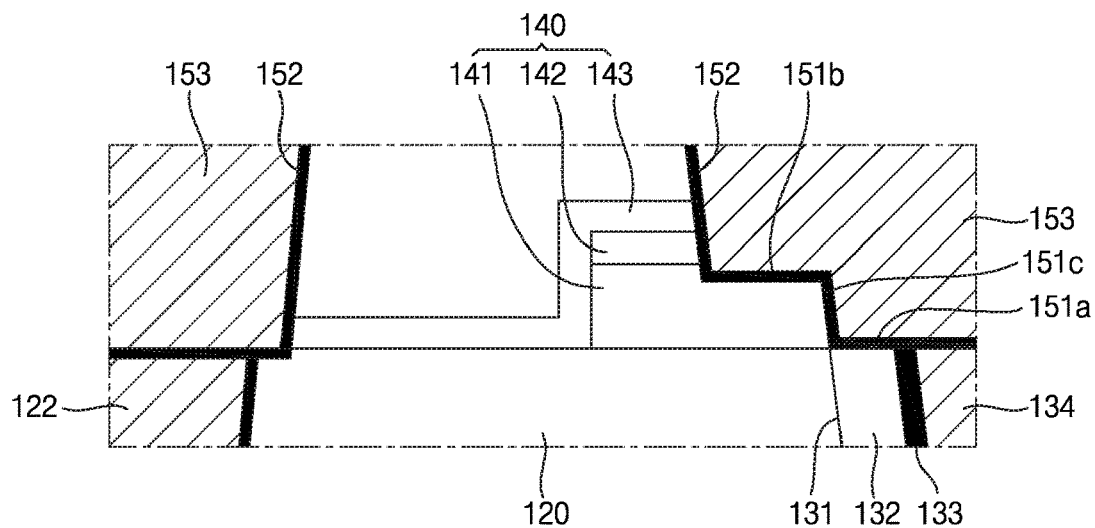
Figure 21:
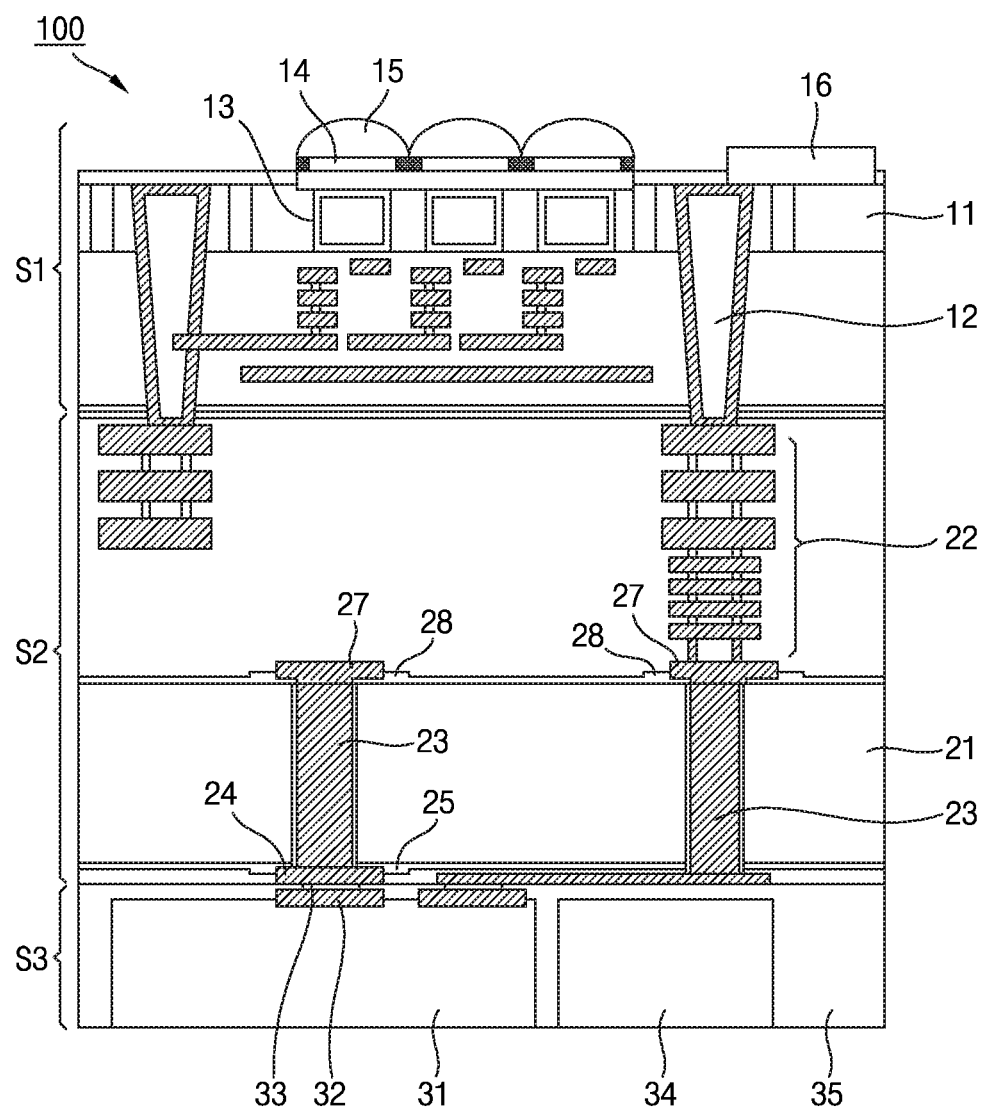
Figure 22:
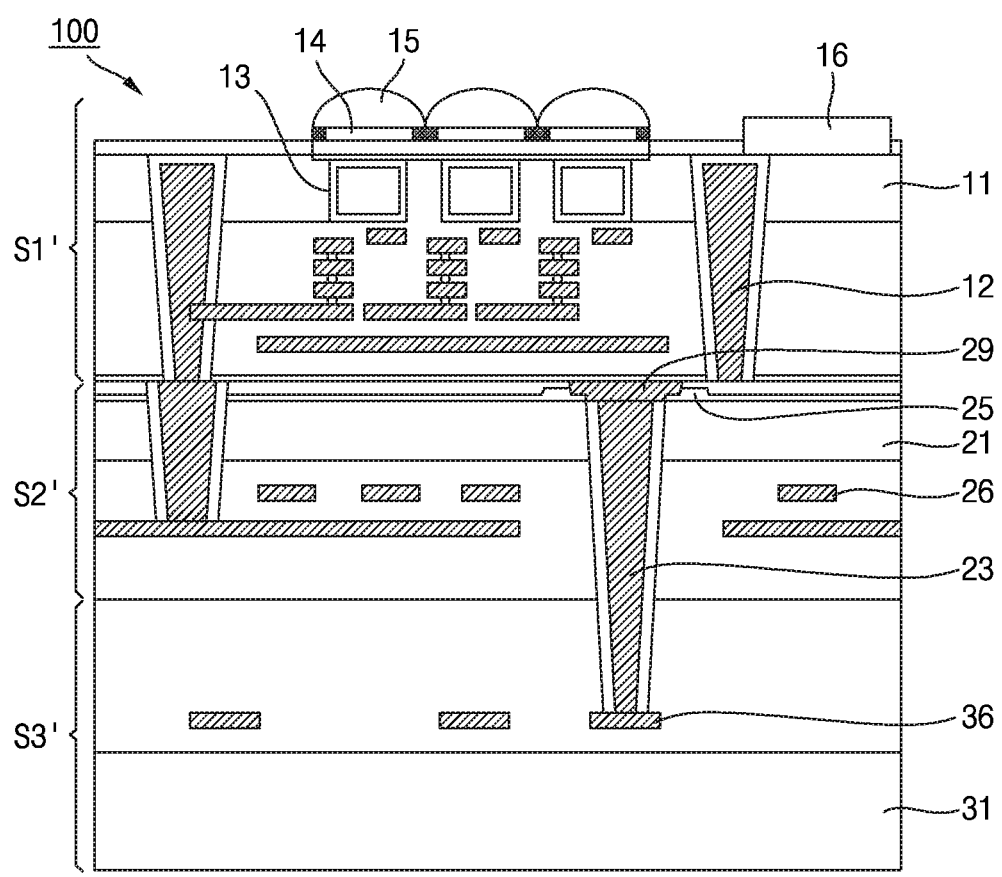

FIG. 2 is an enlarged cross-sectional view of portion A of FIG. 1;

FIGS. 3 to 12, 19, and 20 are cross-sectional views for describing a method of manufacturing a semiconductor device according to some example embodiments and illustrating according to a process sequence;

FIG. 13 is an enlarged cross-sectional view of portion A of FIG. 12;

FIGS. 14 to 18 are enlarged cross-sectional views corresponding to the portion A of FIG. 12 in a semiconductor device according to some example embodiments; and FIGS. 21 and 22 are cross-sectional views illustrating stacked structures of a semiconductor device according to some example embodiments.

DETAILED DESCRIPTION OF EXAMPLE EMBODIMENTS

FIG. 1 is a cross-sectional view for describing a semiconductor device 100 according to some example embodiments.

Referring to FIG. 1, the semiconductor device 100 according to some example embodiments may include a semiconductor structure and a via plug 130. The via plug 130 may fully or partially pass through the semiconductor structure through a via hole 131 formed in the semiconductor structure. Upper and lower ends of the via plug 130 may be respectively connected to connection terminals 170 and 182 through interconnection patterns. The via plug 130 may be a through silicon via (TSV) passing through a silicon substrate 110.

The semiconductor structure according to some example embodiments may include unit devices 121 and a contact 122 on a front surface 110a of the substrate 110. A lower interlayer insulating film 120 may be on the front surface 110a of the substrate 110. An upper interlayer insulating film 150 may be on the lower interlayer insulating film 120. A package substrate 180 and a re-distribution layer 181 may be on a rear surface 110c of the substrate 110. The front surface 110a may be an active surface, and the rear surface 110c may be an inactive surface.

The substrate 110 may include a semiconductor substrate, for example, a silicon substrate. The front surface 110a of the substrate 110, on which the unit devices 121 and the contact 122 are formed, may be covered by the lower interlayer insulating film 120. The lower interlayer insulating film 120 may include silicon oxide (SiO2) and/or silicon nitride (SiN), and may be formed as a single layer or a multilayer.

The unit devices 121 may be formed on the front surface 110a of the substrate 110 by a front-end-of-line (FEOL) process. The unit devices 121 may be individual devices, and may include a metal-oxide-semiconductor field effect transistor (MOSFET), a system large scale integration (LSI) device, a CMOS imaging sensor (CIS), a micro-electromechanical system (MEMS), an active device, a passive device, and/or the like. The unit devices 121 may be electrically separated from each other by the lower interlayer insulating film 120 covering the unit devices 121.

The contact 122 may vertically pass through the lower interlayer insulating film 120 to transmit electrical signals to upper and lower structures of the lower interlayer insulating film 120. The contact 122 may include tungsten (W), aluminum (Al), and/or copper (Cu).

An etch stop layer 141 (see FIG. 3) may be formed on a surface, e.g. an upper surface, of the lower interlayer insulating film 120. The etch stop layer 141 may or include be a silicon nitride (SiN) film, a silicon oxynitride (SiON) film, a silicon oxide (SiO2) film, or the like formed by a chemical vapor deposition (CVD) process. The etch stop layer 141 may form an insulating structure 140 as a single layer or along with another layer.

The via hole 131 may be a trench formed by fully or partially etching the etch stop layer 141, the lower interlayer insulating film 120, and the substrate 110. The via hole 131 may be formed by applying a photoresist (PR) film on the etch stop layer 141, exposing the PR film using a mask pattern, and then etching the via hole 131 according to a shape of a photoresist. The via hole 131 may be formed using an anisotropic etching process, e.g. a Bosch process, or a laser drilling technique.

A buffer portion 132 and a conductive barrier film 133 may be sequentially formed on an inner surface of the via hole 131. The remaining space of the via hole 131 may be filled with a metal by electroplating and/or other deposition methods to form a via electrode 134 on the conductive barrier film 133. The via electrode 134 and a portion of an upper surface of the etch stop layer 141 may be polished by a chemical mechanical polishing (CMP) process. An additional insulating layer may be formed on the polished surface to form the insulating structure 140.

The upper interlayer insulating film 150 may be formed on the insulating structure 140, and an interconnection pattern may be formed by a back-end-of-line (BEOL) process.

The upper interlayer insulating film 150 may include silicon oxide (SiO2) or silicon nitride (SiN), and may be formed as a single layer or a multilayer. The interconnection pattern may be formed as a plurality of interconnection structures for connecting the unit devices 121 formed by an FEOL process to other interconnections on the substrate 110. For example, the interconnection structure may include a metal layer 153 for interconnection, a contact plug 154, and a metal interconnection layer 155.

Each of the metal layer 153 for interconnection, the contact plug 154, and the metal interconnection layer 155 may include at least one metal selected from among tungsten (W), aluminum (Al), and copper (Cu).

The metal layer 153 for interconnection may be formed by plating an interconnection hole 151 with a metal. The interconnection hole 151 may be formed by etching the insulating structure 140, the contact 122 at a lower end of the insulating structure 140, and a portion of the via plug 130.

An upper insulating film 160 may be formed at an upper end of the upper interlayer insulating film 150. The upper insulating film 160 may be a passivation layer including silicon nitride (SiN) and/or polyimide. Upper connection terminals 170, which are connected to front pads 156 at an uppermost end of the interconnection pattern through connection holes 161, may be on the upper insulating film 160.

A portion of a lower end of the via plug 130 may be removed from a rear surface 110b (see FIG. 19) of the substrate 110 using a CMP process, an etch-back process, or a combination thereof.

The package substrate 180 including the re-distribution layer 181 may be connected to the rear surface 110c of the substrate 110, which is exposed by the CMP process. The exposed surface of the lower end of the via plug 130 may be connected to a connection terminal 182 by the re-distribution layer 181. The semiconductor device 100 according to example embodiments are not limited to the configuration described above with reference to FIG. 1.

Among processes of manufacturing the semiconductor device 100 according to some example embodiments, processes from after the FEOL process to the process of forming the via plug 130 will be described below.

After an FEOL structure is formed on the front surface 110a of the substrate 110, the lower interlayer insulating film 120 may be on the front surface 110a of the substrate 110. The lower interlayer insulating film 120 may include silicon oxide (SiO2). The etch stop layer 141 may be formed on the surface of the lower interlayer insulating film 120. The etch stop layer 141 may be an insulating layer including silicon nitride (SiN), silicon oxynitride (SiON), silicon carbide (SiC), silicon carbon nitride (SiCN), and/or the like.

After the etch stop layer 141 is formed, the etch stop layer 141, the lower interlayer insulating film 120, and a portion of the substrate 110 may be etched so as to pass therethrough to form a trench-shaped via hole 131. The buffer portion 132 and the conductive barrier film 133 may be formed, e.g. conformally formed, inside the via hole 131. The remaining space of the via hole 131 may be filled with a metal film to form the via electrode 134 on the conductive barrier film 133. The via plug 130 including the via electrode 134, the conductive barrier film 133, and the buffer portion 132 may be formed.

The buffer portion 132 may serve as a buffer for relieving stress, e.g. thermal stress, due to thermal expansion or the like of the via electrode 134. The buffer portion 132 may include an insulating material such as silicon oxide (SiO2) and silicon nitride (SiN). For example, the buffer portion 132 may be formed of an oxide film, a nitride film, a carbide film, a polymer, or a combination thereof. The buffer portion 132 may be formed by a CVD process.

The conductive barrier film 133 may prevent a metal contained in the via electrode 134 from diffusing into the substrate 110. The conductive barrier film 133 may be formed as a conductive layer including a relatively low interconnection resistance. For example, the conductive barrier film 133 may include titanium (Ti), titanium nitride (TiN), titanium tungsten (TiW), tantalum (Ta), tantalum nitride (TaN), tungsten (W), tungsten nitride (WN), tungsten carbide (WC), ruthenium (Ru), cobalt (Co), manganese (Mn), nickel (Ni), and/or the like. The conductive barrier film 133 may be formed as a single layer or a multiplayer. The conductive barrier film 133 may be formed by a physical vapor deposition (PVD) process, a chemical vapor deposition (CVD) process, and/or an atomic layer deposition (ALD) process.

The metal film constituting the via electrode 134 may be formed by electroplating a metal such as silver (Ag), gold (Au), copper (Cu), aluminum (Al), tungsten (W), indium (In), or the like. For example, the metal film may be made of copper (Cu), a copper-based alloy (Cu—Sn, Cu—Mg, Cu—Ni, Cu—Zn, Cu—Pd, Cu—Au, Cu—Re, or Cu—W), tungsten (W), or a tungsten-based alloy.

Although not illustrated, a metal seed layer may be formed on the conductive barrier film 133. The metal film may be grown from the metal seed layer by the electroplating to fill the via hole 131. The metal seed layer may be made of copper (Cu), a copper-based alloy (Cu—Co or Cu—Ru), cobalt (Co), nickel (Ni), or ruthenium (Ru).

FIG. 2 is an enlarged cross-sectional view of portion A of FIG. 1. Referring to FIG. 2, the insulating structure 140 may have a portion with a variable thickness or a variable number of layers around metal layer 153. The insulating structure 140 may be formed to have a different number of layers, and/or a different thickness, according to a shape of the metal layer 153 and/or a positional relationship with a side, e.g. a circumferential side surface of the metal layer 153.

FIGS. 3 to 18 are cross-sectional views for describing a method of manufacturing the semiconductor device 100 according to some example embodiments and illustrating according to a process sequence. A process sequence after forming the via plug 130 in the semiconductor device 100 will be described with reference to FIGS. 3 to 18.

Figure 3:
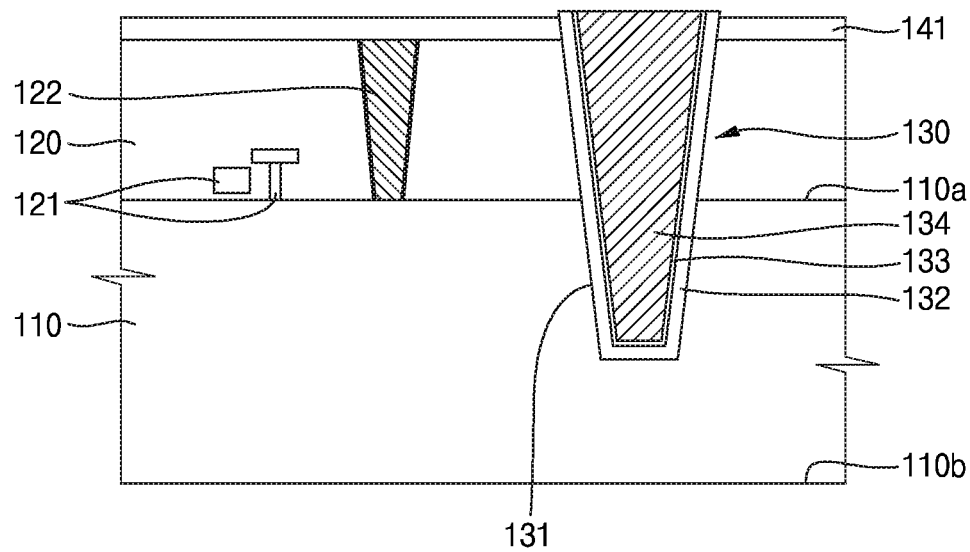

Referring to FIG. 3, the semiconductor structure with the via plug 130 formed thereon may be polished by a CMP process. Upper ends of the etch stop layer 141 and the via electrode 134 may be exposed by the CMP process. As illustrated above, the upper end of the via electrode 134 after the completion of the etching may protrude above the upper end of the etch stop layer 141 due to a material difference between the etch stop layer 141 and the via electrode 134.

In the CMP process, the etch stop layer 141 may serve an etch stopper, and may have a relatively low etch rate, e.g. an etch rate lower than other films. The etch stop layer 141 may be an insulating layer made of a silicon nitride (SiN) film, a silicon oxynitride (SiON) film, a silicon carbide (SiC) film, a silicon carbon nitride (SiCN) film, a silicon oxide (SiO2) film, and/or the like, which is formed by a CVD process. Since the insulating layer used as the etch stop layer 141 is removed by an etch-back process later, a cost may be reduced by using a low-cost material for the insulating layer. For example, a silicon nitride (SiN) film including a dielectric constant (k) greater than that of an oxide-based material may be used as the etch stop layer 141. The etch stop layer 141 and the via plug 130 may be exposed by cleaning residues formed by the CMP process.

FIGS. 4 to 8 are cross-sectional views of a process of forming the insulating structure 140 according to some example embodiments.

Figure 4:
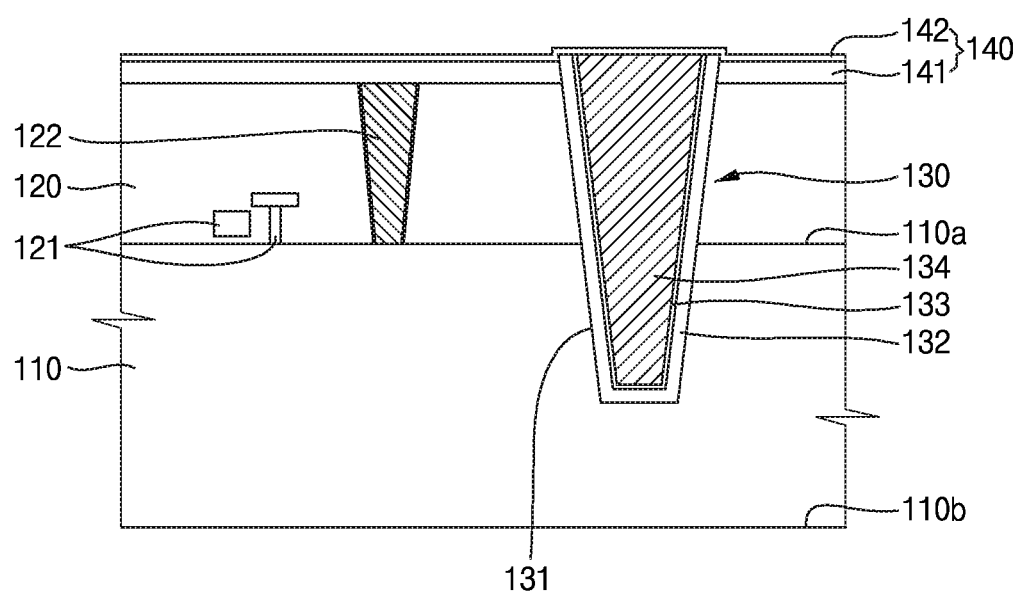

Referring to FIG. 4, an additional insulating layer 142 may be formed on upper surfaces of the exposed etch stop layer 141 and via plug 130. An insulating layer formed on the upper surface of the exposed etch stop layer 141 is referred to as a first insulating layer 142. A second insulating layer 143 (see FIG. 8) may be sequentially formed on the first insulating layer 142. The insulating structure 140 may include the etch stop layer 141 and the additional insulating layers 142 and 143.

The first insulating layer 142 may be formed by depositing a silicon carbon nitride (SiCN) film, a silicon oxynitride (SiON) film, and/or the like, by a CVD and/or PVD method. As illustrated above, the upper end of the via electrode 134, which is a metal film, may protrude more than the etch stop layer 141 even after the CMP process. The first insulating layer 142 may also be formed at a higher position above the via electrode 134 than a position above the lower interlayer insulating film 120.

Figure 5:
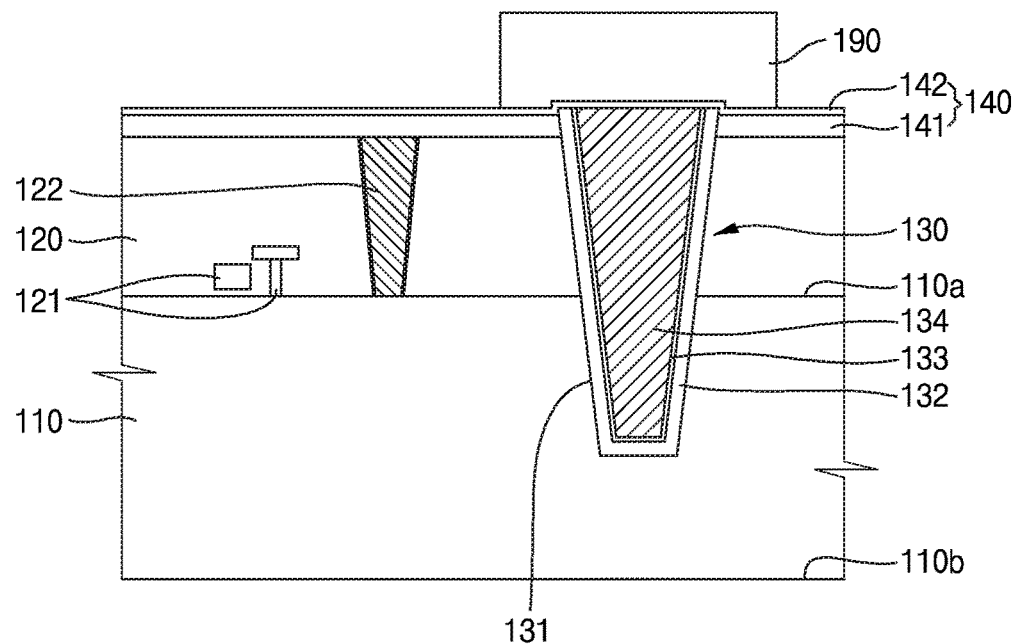

Referring to FIG. 5, a protective film 190 may be on the first insulating layer 142. The protective film 190 may be a photoresist. The photoresist may be formed by applying a PR film on an upper end of the first insulating layer 142 and then performing a selective exposure process and a development process. As illustrated above, the protective film 190 may be formed to cover the via plug 130. The protective film 190 may be formed to cover an upper end of the via plug 130 and a periphery thereof.

Figure 6:
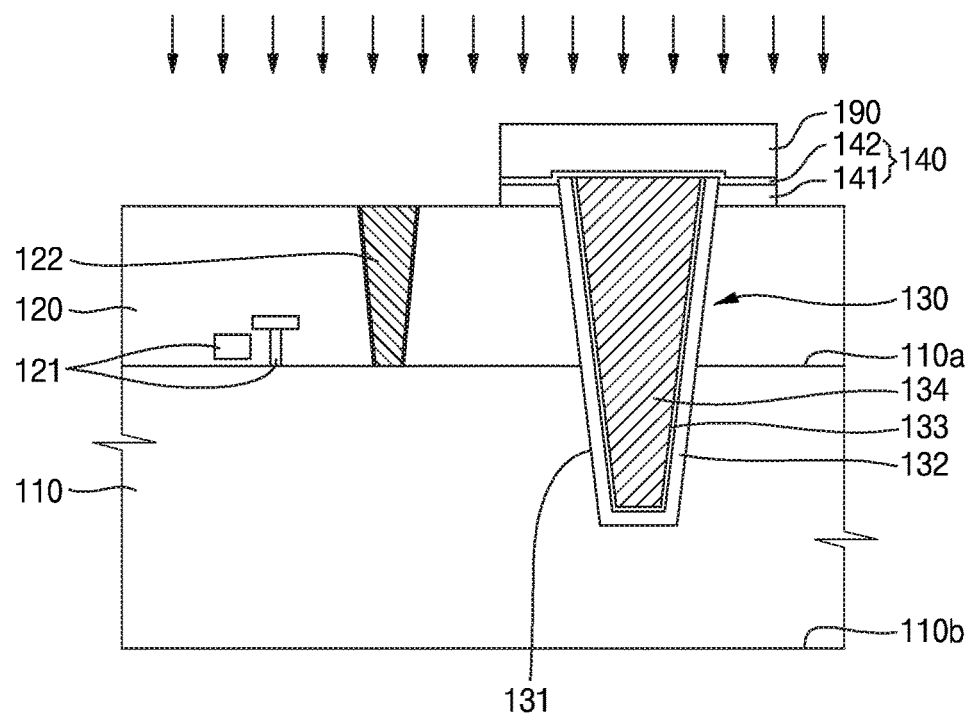

Referring to FIG. 6, an etch-back process may be performed on the semiconductor structure with the protective film 190 thereon. The etch-back process may be performed in a dry manner. For example, sputter etching using sputtering, reactive ion etching (RIE), vapor phase etching, or the like may be used.

Figure 7:
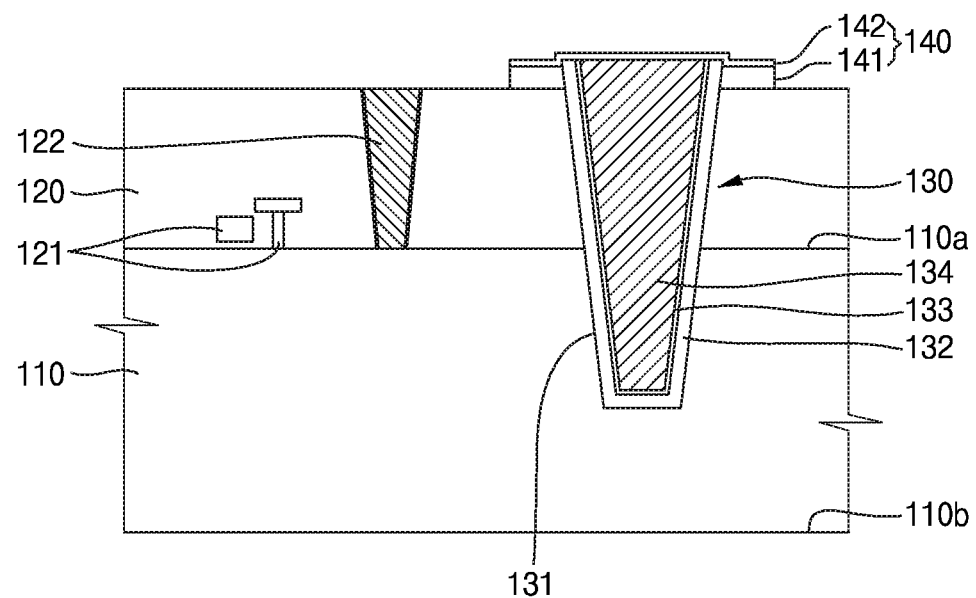

The first insulating layer 142 and the etch stop layer 141 on which the protective film 190 is not present may be removed by the etch-back process. The first insulating layer 142 and the etch stop layer 141 which are present under the protective film 190 may remain without being removed. Accordingly, there may be a height difference between a portion of the insulating structure 140 in which the protective film 190 is not present and a portion of the insulating structure 140 in which the protective film 190 is present. Referring to FIG. 7, after the etch-back process, the protective film 190 may be removed. When the protective film 190 is a photoresist, the photoresist may be separated from an upper surface of the semiconductor structure by an ashing, e.g. an oxygen ashing, process. After the ashing process, a cleaning operation may be performed on the upper surface of the semiconductor structure, that is, an upper surface of the remaining insulating structure 140 and upper surfaces of the exposed lower interlayer insulating film 120 and the contact 122. Although not illustrated, the insulating structure 140 may be partially removed without using the protective film 190 to form a shape of the insulating structure 140 as illustrated in FIG. 7.

Figure 8:
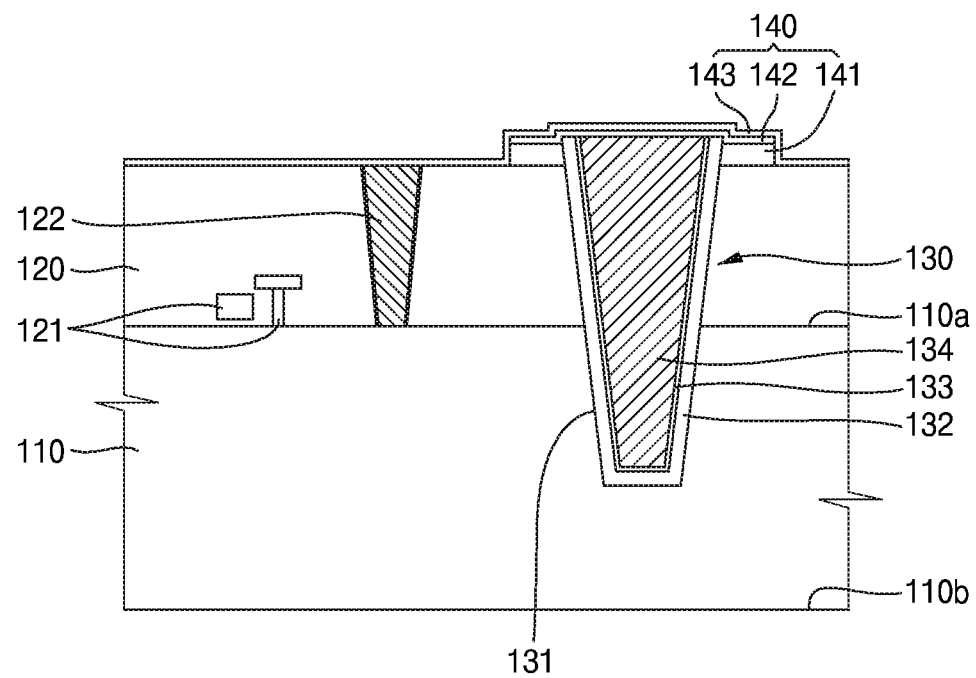

Referring to FIG. 8, the second insulating layer 143 may be formed as an additional insulating layer on the upper surface of the semiconductor structure from which the protective film 190 is removed. The second insulating layer 143 may be a silicon carbon nitride (SiCN) film, a silicon oxynitride (SiON) film, or the like deposited by a CVD or PVD method. The second insulating layer 143 may be further deposited to form the insulating structure 140 including the etch stop layer 141, the first insulating layer 142, and the second insulating layer 143.

The insulating structure 140 may have a different layered structure according to a positional relationship with the via plug 130. As illustrated above, the insulating structure 140 may include the first insulating layer 142 and the second insulating layer 143 at the upper end of the via plug 130. The insulating structure 140 may include only the second insulating layer 143 in a portion in which the via plug 130 is not formed. The insulating structure 140 may include all of the etch stop layer 141, the first insulating layer 142, and the second insulating layer 143 in the vicinity of the via plug 130.

For example, the insulating structure 140 at the upper end of the via plug 130 may be formed to be thicker than the insulating structure 140 at an upper end of the portion in which the via plug 130 is not formed. Further, the insulating structure 140 formed in the vicinity of the via plug 130 may be thicker than the insulating structure 140 formed at the upper end of the via plug 130. The insulating structure 140 at the upper end of the via plug 130 may be formed at a higher position than the insulating structure 140 in the other portion.

Figure 9:
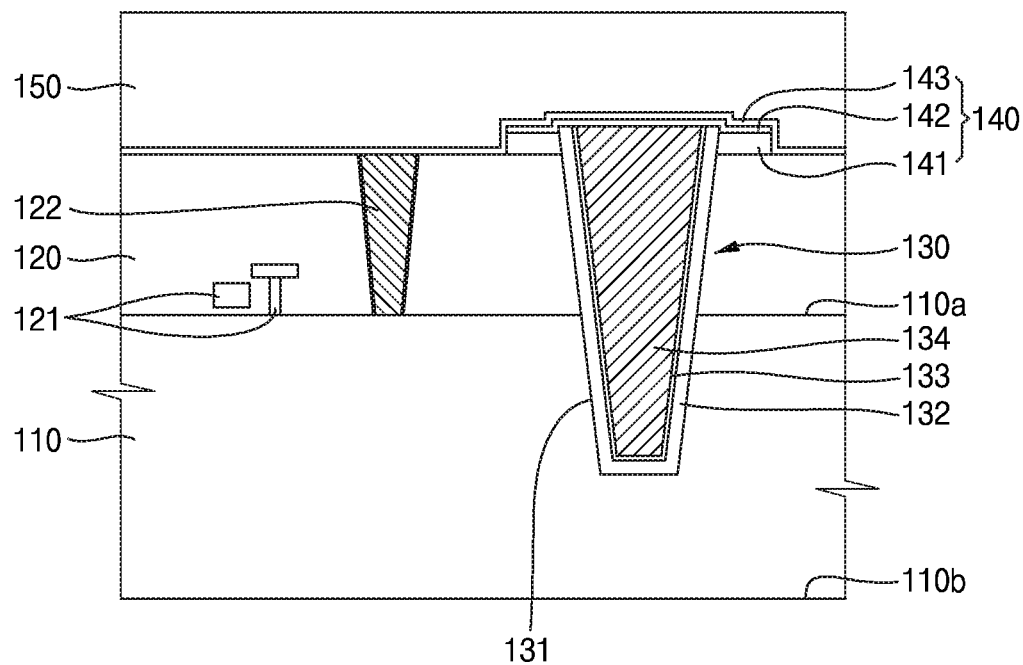

Referring to FIG. 9, the upper interlayer insulating film 150 may be formed on the insulating structure 140. The upper interlayer insulating film 150 may form a BEOL structure such as an interconnection pattern or the like. The upper interlayer insulating film 150 may be a silicon carbon nitride (SiCN) film like the lower interlayer insulating film 120. The upper interlayer insulating film 150 may be formed as an interlayer insulating film including a low dielectric constant (low-k) by using the silicon carbon nitride (SiCN) film. In this case, a delay of a signal transmission speed due to interconnection resistance or parasitic capacitance may be reduced by combining with an interconnection pattern including copper (Cu).

Figure 10:
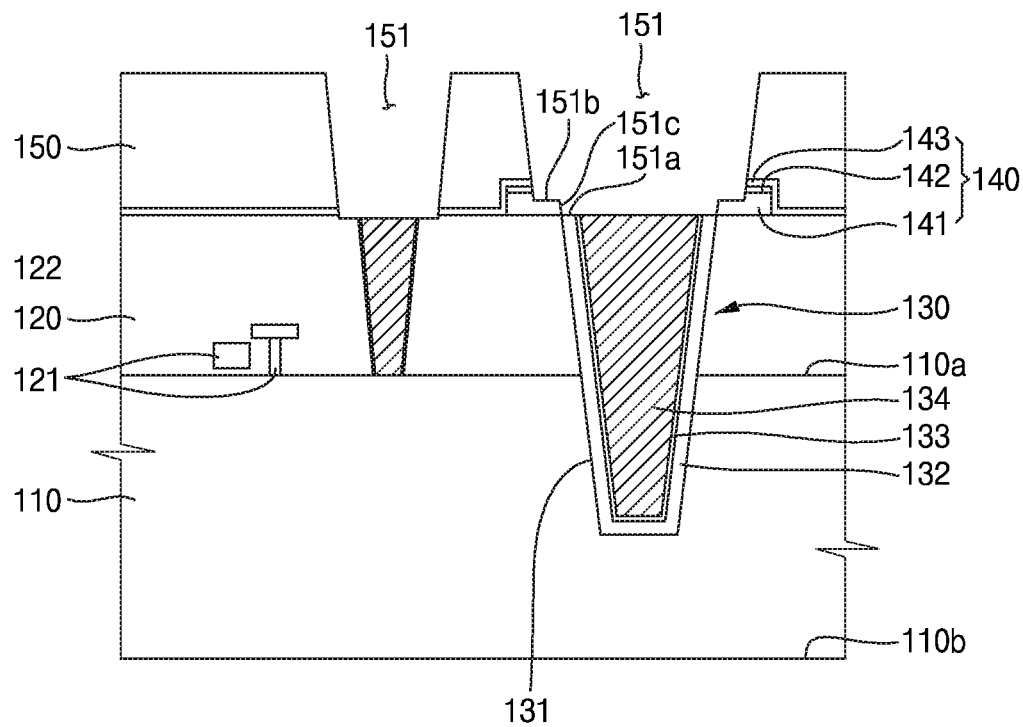

Referring to FIG. 10, the upper interlayer insulating film 150 may be patterned to form the interconnection holes 151 which expose the upper surface of the via plug 130. The insulating structure 140 may be used as an etch stopper when the interconnection hole 151 is formed. The interconnection hole 151 may have a trench shape.

The interconnection holes 151 may have different etch depths according to a thickness of the insulating structure 140. As illustrated above, the interconnection hole 151 may be formed on the contact 122 by patterning. The insulating structure 140 on the contact 122 before forming the interconnection hole 151 may include only the second insulating layer 143. The interconnection hole 151 formed on the contact 122 may be formed by the second insulating layer 143 and a portion of the lower interlayer insulating film 120 being etched thereto.

When the insulating structure 140 includes the first insulating layer 142 and the etch stop layer 141 in addition to the second insulating layer 143, the interconnection hole 151 including a multi-layer structure having steps with different etch depths may be formed by an etch-back process.

Referring again to FIG. 9, the insulating structure 140 on the via plug 130 may include the first insulating layer 142 and the second insulating layer 143. As illustrated in FIG. 10, at a position corresponding to an upper portion of the via plug 130, the interconnection hole 151 may be formed by the second insulating layer 143, the first insulating layer 142, and the upper end of the via electrode 134 being etched thereto. The exposed upper end of the via electrode 134 in the interconnection hole 151 formed by etching may become a first lower surface 151a (see FIG. 13) of the interconnection hole 151.

The insulating structure 140 including the etch stop layer 141, the first insulating layer 142, and the second insulating layer 143 may be formed in the vicinity of the upper surface of the via plug 130. In the case in which the insulating structure 140 includes the etch stop layer 141, a second lower surface 151b including a relatively shallow etch depth may be formed when an etch-back process for forming the interconnection hole 151 is performed. A side surface 151c may be formed when the etch-back process for forming the interconnection hole 151 is performed. The lower surfaces 151a and 151b of the interconnection hole 151 may be formed to have a multi-layer structure with a step, e.g. a step corresponding the side surface 151c, according to position and/or a thickness of the etch stop layer 141. A difference in etch depths between the first lower surface 151a and the second lower surface 151b may vary according to an etch selectivity of a material to be etched.

In the semiconductor structure in which the interconnection hole 151 is formed, the insulating structure 140 formed in the vicinity of via plug 130 may be thicker than the insulating structure 140 formed in a portion in which the via plug 130 is not present. That is, due to the etch stop layer 141 and the first insulating layer 142 remaining after the etch-back process, the insulating structure 140 in the vicinity of the via plug 130 may be formed to be thicker than the insulating structure 140 in the other portion.

Figure 11:
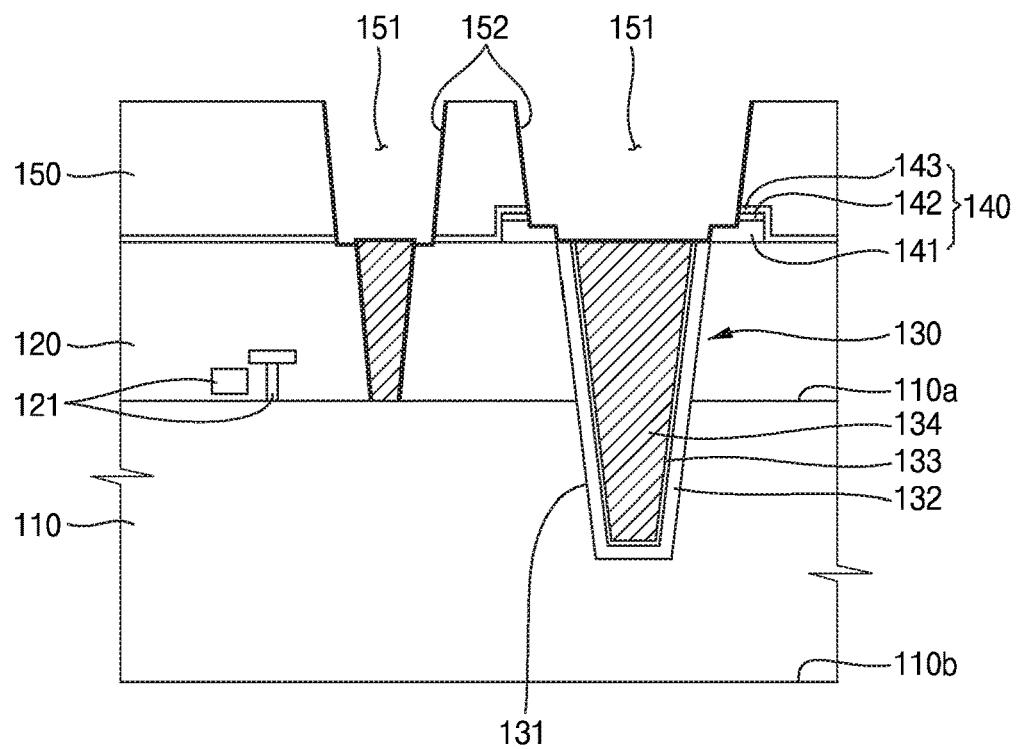

Referring to FIG. 11, an interconnection barrier film 152 may be formed inside the interconnection hole 151. The interconnection barrier film 152 may include titanium (Ti), titanium nitride (TiN), titanium tungsten (TiW), tantalum (Ta), tantalum nitride (TaN), tungsten (W), tungsten nitride (WN), tungsten carbide (WC), ruthenium (Ru), cobalt (Co), manganese (Mn), nickel (Ni), and the like. The interconnection barrier film 152 may be formed by a PVD process; however, inventive concepts are not limited thereto.

Referring to FIG. 12, the metal layer 153 for interconnection may be formed by electroplating a metal film in the interconnection hole 151 in which the interconnection barrier film 152 is formed.

The metal film may be formed by electroplating a metal such as silver (Ag), gold (Au), copper (Cu), aluminum (Al), tungsten (W), indium (In), or the like. For example, the metal film may be made of copper (Cu), a copper-based alloy (Cu—Sn, Cu—Mg, Cu—Ni, Cu—Zn, Cu—Pd, Cu—Au, Cu—Re, or Cu—W), tungsten (W), or a tungsten-based alloy.

Although not illustrated, a metal seed layer may be formed on the interconnection barrier film 152. A metal film for forming the metal layer 153 for interconnection may be grown from the metal seed layer. The metal layer 153 for interconnection may have a first lower surface and a second lower surface corresponding to a shape of the interconnection hole 151 and including a step.

The insulating structure 140 may be on a lower portion and a side portion of the second lower surface of the metal layer 153 for interconnection. As illustrated above, the insulating structure 140 may not be under the circumferential surface of the metal layer 153 for interconnection formed on the contact 122. In contrast, the insulating structure 140 may be on a lower portion and a side portion of the circumferential surface of the metal layer 153 for interconnection formed on the via plug 130. Further, the insulating structure 140 under and around a circumferential surface of the via plug 130 may not have a constant thickness and may have a step.

FIG. 13 is an enlarged cross-sectional view of portion A of FIG. 12.

Referring to FIG. 13, the etch stop layer 141 and the first insulating layer 142, which remain without being removed after the etch-back process, may be on a side portion of the circumferential surface of the metal layer 153 or under the second lower surface of the metal layer 153. The etch stop layer 141 may have higher etching resistance than the first insulating layer 142 and the second insulating layer 143. When the etch stop layer 141 has a relatively high etching resistance, the first lower surface 151a of the interconnection hole 151 may be etched to be deeper than the second lower surface 151b. The via plug 130 may be under the first lower surface 151a. The insulating structure 140 may be under the second lower surface 151b including a shallow etch depth than the first lower surface 151a or a portion in which the via plug 130 is not formed. The insulating structure 140 may have a different thickness according to a step between the first lower surface and the second lower surface of the metal layer 153 for interconnection. The insulating structure 140 may be formed as one layer on an inside of the circumferential side surface of the metal layer 153 for interconnection and may be formed as three layers on an outside of the circumferential surface thereof.

As illustrated above, the second lower surface of the metal layer 153 for interconnection may be formed by a portion of the etch stop layer 141 being etched thereto. The thickness of the insulating structure 140 under the second lower surface of the metal layer 153 for interconnection may be less than the thickness of the etch stop layer 141. That is, the second lower surface of the metal layer 153 for interconnection may correspond to a position at which a portion of the upper surface of the etch stop layer 141 is etched.

The insulating structure 140 including the etch stop layer 141, the first insulating layer 142, and the second insulating layer 143 which remain without being etched may be present on a side portion of the metal layer 153 for interconnection.

The side portion of the metal layer 153 for interconnection may be a position corresponding to an outside of the circumferential surface of the via plug 130. The thickness of the insulating structure 140 on the side portion of the metal layer 153 for interconnection may be equal to a sum of the thicknesses of the etch stop layer 141, the first insulating layer 142, and the second insulating layer 143.

FIGS. 14 to 18 are enlarged cross-sectional views corresponding to the portion A of FIG. 12 in the semiconductor device according to some example embodiments.

Figure 14:
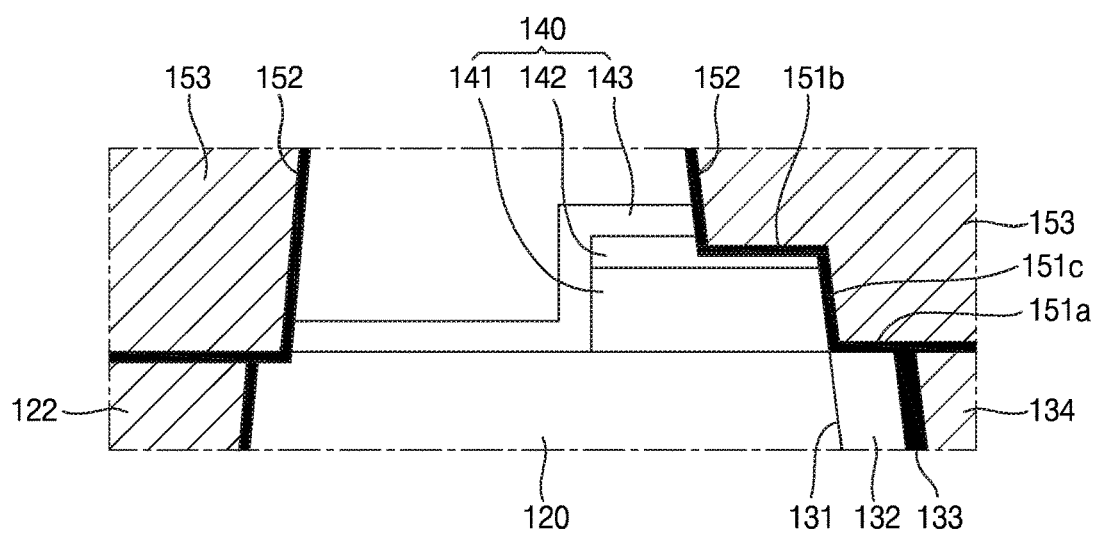
Figure 15:
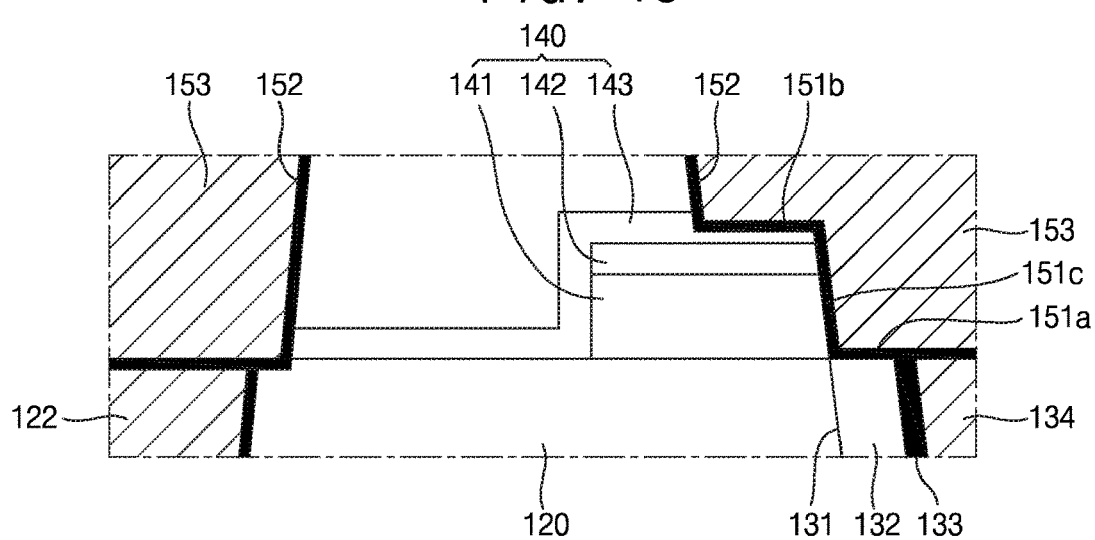

Referring to FIGS. 14 and 15, the interconnection hole 151 may be formed to have a different depth according to an etch selectivity. As illustrated in FIG. 14, the insulating structure 140 may be formed as two layers, e.g. etch stop layer 141 and insulating layer 142, on the inside of the circumferential surface of the metal layer 153 for interconnection and may be formed as two layers, e.g. insulating layer 142 and second insulating layer 143, on the outside of the circumferential surface thereof. As illustrated in FIG. 15, the insulating structure 140 may have a different number of layers on the inside and the outside of the circumferential surface of the metal layer 153 for interconnection. For example, inside the circumferential surface of the metal layer 153, the insulating structure 140 may include etch stop layer 141, insulating layer 142, and second insulating layer 143. Outside of the circumferential surface of the second metal layer 153 formed on the contact 122, the insulating structure 140 may include the second insulating layer 143. Additionally or alternatively, the insulating structure 140 on the outside of the circumferential surface of the metal layer 153 for interconnection may be formed to be thicker than the insulating structure 140 on the inside of the circumferential surface of the metal layer 153 for interconnection.

Figure 16:
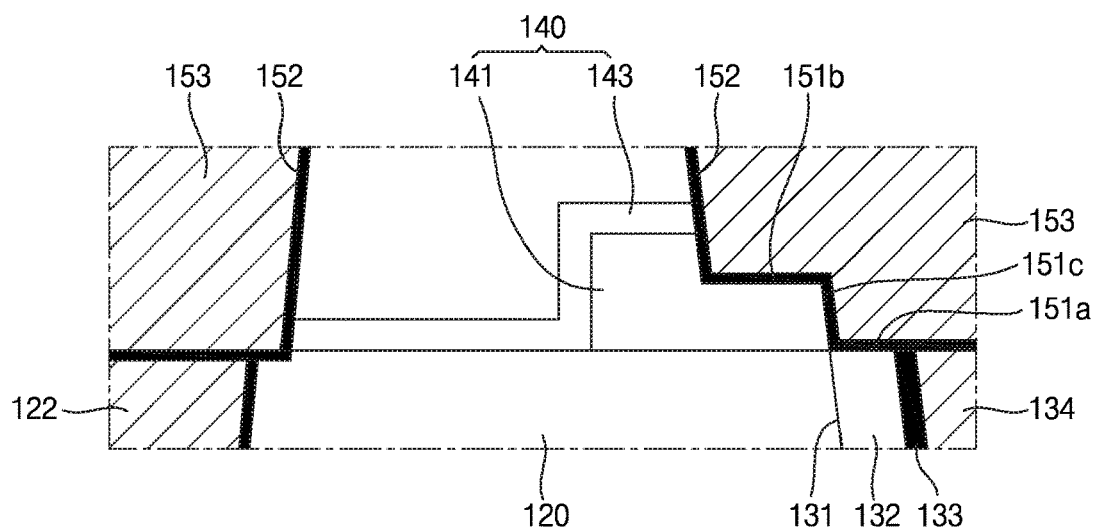

Referring to FIG. 16, the insulating structure 140 may have two layered structures. For example, the insulating structure 140 may include only the etch stop layer 141 and the second insulating layer 143. As illustrated in the embodiment, the insulating structure 140 may be formed as one layer on the inside of the circumferential surface of the metal layer 153 for interconnection and may be formed as two layers on the outside of the circumferential surface of the metal layer 153 for interconnection.

Figure 17:
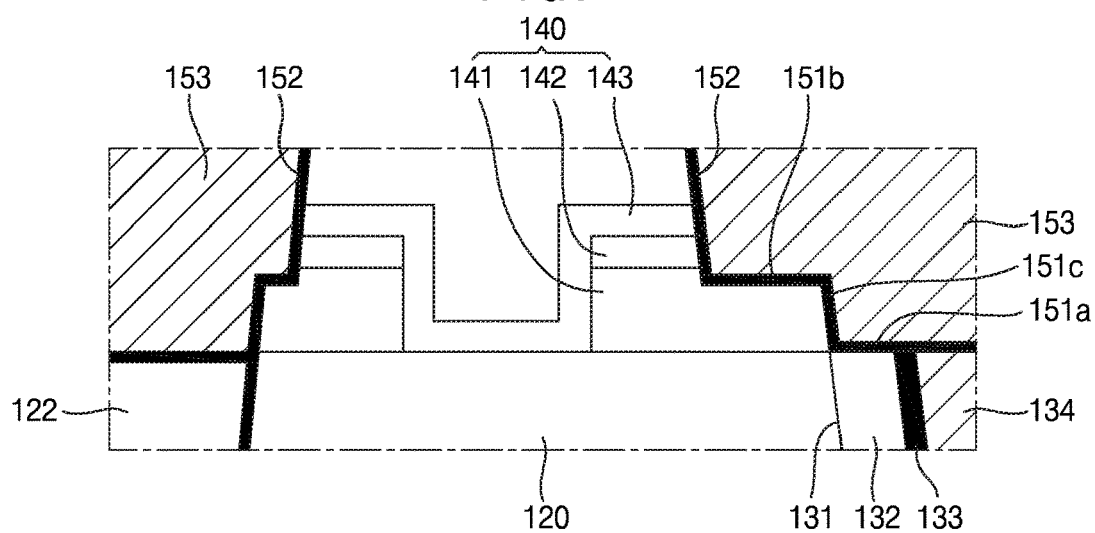

Referring to FIG. 17, some example embodiments may be applied to the metal layer 153 for interconnection formed on the contact 122 in addition to the metal layer 153 for interconnection on the via plug 130.

Figure 18:
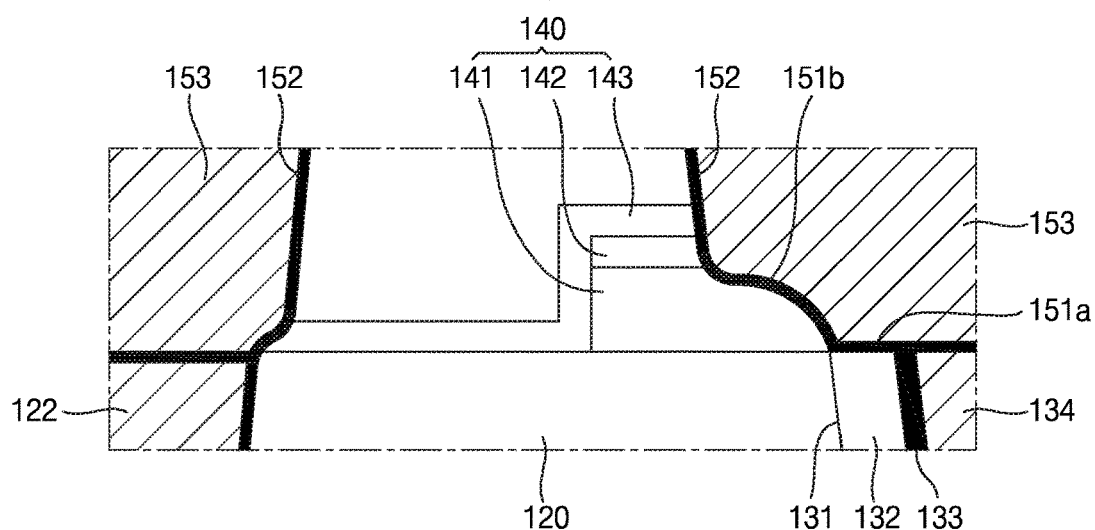

Referring to FIG. 18, a lower end of the interconnection hole 151 may be formed as an inclined surface. For example, a lower end of the circumferential surface almost vertical may be a curved surface inclined to a bottom surface of the interconnection hole 151, or a curved surface including a step. The insulating structure 140 may have a different layered structure and thickness according to a positional relationship with an edge of the bottom surface of the metal layer 153 for interconnection. In the illustrated embodiment, the insulating structure 140 may be formed as one layer at a position adjacent to the edge of the bottom surface of the metal layer 153 for interconnection. The insulating structure 140 may be formed as two or more layers at a position apart from the edge of the bottom surface of the metal layer 153 for interconnection. For example, the insulating structure 140 formed on the outside of the circumferential surface of the metal layer 153 for interconnection may be formed as three layers.

Figure 19:
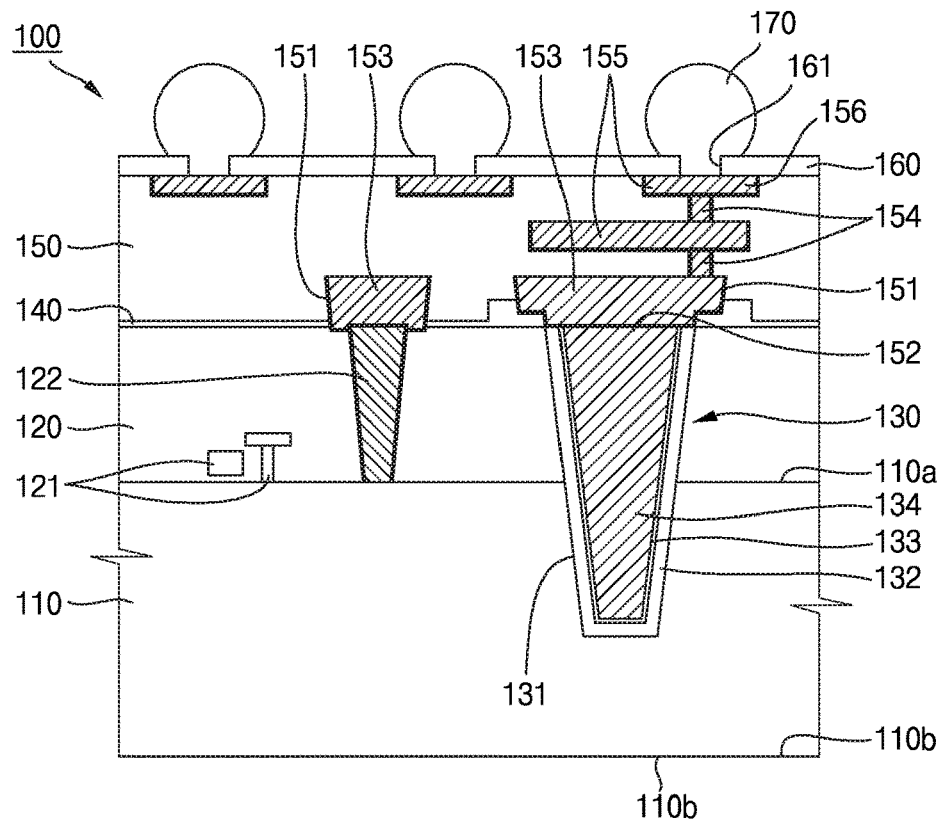

Referring to FIG. 19, the interconnection structure may be formed by a BEOL operation. The contact plug 154 including the same stacked structure as the metal layer 153 for interconnection may be formed on the metal layer 153 for interconnection by a method similar to that of forming the metal layer 153 for interconnection. The metal interconnection layer 155 may be formed on the contact plug 154 in the same manner as the metal layer 153 for interconnection and the contact plug 154 may be formed thereon again. The metal interconnection layer 155 and the contact plug 154 may be alternately formed to form an interconnection structure in which a metal layer 153 for interconnection, a plurality of metal interconnection layers 155, and a plurality of contact plugs 154 are alternately connected.

The interconnection structure may transmit an electrical signal in a horizontal direction of the upper interlayer insulating film 150. The interconnection structure may include a conductor such as doped silicon, a metal, a metal silicide, a metal alloy, and/or a metal compound. The interconnection structure may include a front pad. The front pad may include a metal such as copper (Cu), aluminum (Al), or tungsten (W).

The upper insulating film 160, which may be a passivation film, may be formed on the upper interlayer insulating film 150 which surrounds the interconnection structure. The upper insulating film 160 may be made of a silicon oxide (SiO2) film, a silicon nitride (SiN) film, a polymer, or a combination thereof. The connection holes 161 which expose the front pads 156 connected to the interconnection structure may be formed on the upper insulating film 160. The front pad 156 may electrically connect a portion of the interconnection structure at an uppermost portion to the upper connection terminal 170. For example, the front pads 156 may be connected to the upper connection terminals 170 through the connection holes 161.

Figure 20:
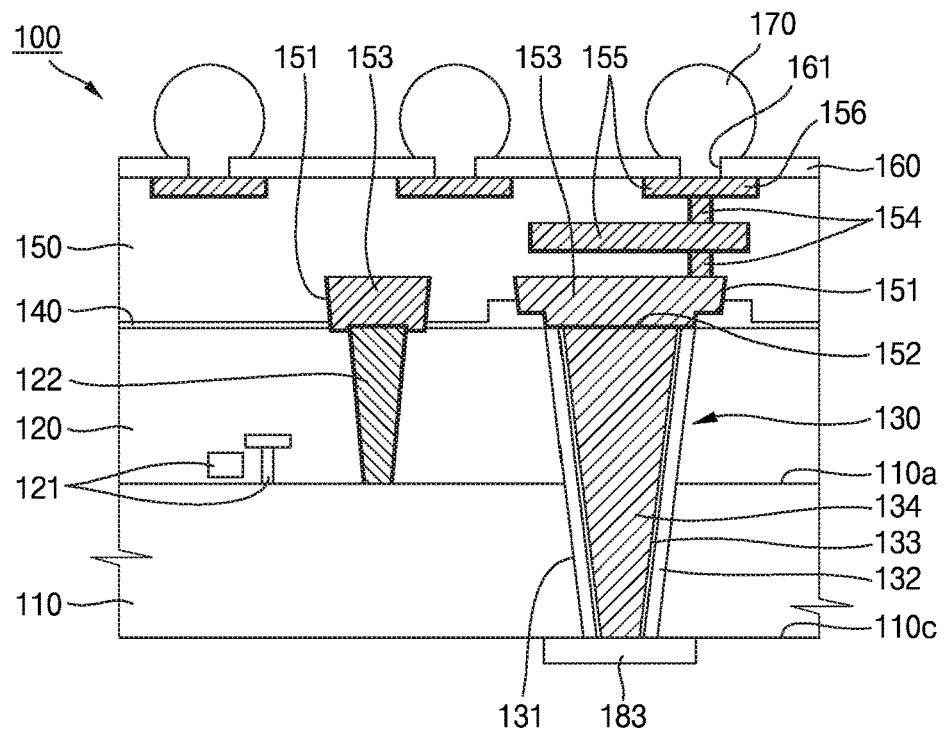

Referring to FIG. 20, the rear surface 110c of the substrate 110 and a portion of the lower end of the via plug 130 may be polished by a CMP process so that the lower end of the via plug 130 is exposed. The illustrated rear surface 110c of the substrate 110 may be a newly formed rear surface by the CMP process. A lower connection terminal 183 connected to the lower end of the via plug 130 may be formed on the rear surface 110c of the substrate 110.

The upper connection terminals 170 and the lower connection terminal 183 are not limited to the illustrated shapes, and may have a shape of a solder ball, a solder bump, a re-distribution structure, or a front pad. In an embodiment, at least one of the upper connection terminals 170 and the lower connection terminal 183 may be omitted.

FIGS. 21 and 22 are cross-sectional views illustrating stacked structures of a semiconductor device 100 according to some example embodiments.

The semiconductor device 100 according to some example embodiments may be formed as a multi-chip stacked package.

Referring to FIG. 21, the semiconductor package may be a multi-layered device, and may be formed by stacking individual semiconductor devices S1, S2, and S3 by a chip on wafer (COW) manner. As illustrated above, the semiconductor package may include an upper device S1, an intermediate device S2, and a lower device S3. For example, the upper device S1 may include an image sensor, the intermediate device S2 may include a logic device such as a microprocessor, and the lower device S3 may include a memory device such as a dynamic random access memory (DRAM). The upper device S1 and the intermediate device S2, and the intermediate device S2 and the lower device S3 may be electrically connected through via plugs 12 and 23, respectively.

The upper device S1 may include photodiodes 13 formed at an upper substrate 11, color filters 14, micro lenses 15, via plugs 12, and an I/O pad 16. The intermediate device S2 may include an intermediate substrate 21, an interconnection structure 22, via plugs 23, a re-distribution structure 24, and an insulating structure 25. The lower device S3 may include a DRAM chip 31, a re-distribution structure 32, a dummy structure 34, and/or a molding portion 35 in a chip form.

The upper device S1 and the intermediate device S2 may be electrically connected by the via plug 12. The via plug 12 may be a backside via stack (BVS). The intermediate device S2 and the lower device S3 may be electrically connected by the respective re-distribution structures 24 and 32 being bonded using a solder bump 33 in a COW manner. The insulating structure 25 of some example embodiments may be applied to a metal layer for interconnection of the re-distribution structure 24 formed at an end of the via plug 23. Further, an insulating structure 28 of some example embodiments may also be applied under a metal layer 27 for interconnection on the substrate 21 in a position between an interlayer insulating film of the intermediate device S2 and the substrate 21. Further, although not illustrated, some example embodiments may also be applied to an end of the via plug 12.

As illustrated above, in the case in which the individual devices S1, S2, and S3 are stacked by a COW manner, the lower device S3 in a chip form may be stacked thereon only when a structure in which the upper device S1 and the intermediate device S2 are stacked is determined to be quality goods, and thus a yield may be improved.

Referring to FIG. 22, the semiconductor package may be a multi-layered device, and may be formed by stacking individual devices S1', S2', and S3' by a wafer-on-wafer (WOW) manner. As illustrated above, the semiconductor package may include an upper device S1', an intermediate device S2', and a lower device S3'. For example, the upper device S1' may include an image sensor, the intermediate device S2' may include a memory device such as a DRAM, and the lower device S3' may include a logic device such as a microprocessor. The upper device S1' and the intermediate device S2', and the intermediate device S2' and the lower device S3' may be electrically connected through via plugs 12 and 23, respectively.

The upper device S1' may include photodiodes 13, color filters 14, micro lenses 15, via plugs 12, and an I/O pad 16 formed at an upper substrate 11. The intermediate device S2' may include an intermediate substrate 21, an interconnection layer 26, a via plug 23, a metal layer 29 for interconnection, and an insulating structure 25. The lower device S3' may include a lower substrate 31 and an interconnection layer 36.

The upper device S1' and the intermediate device S2' may be electrically connected by the via plug 12, and the intermediate device S2' and the lower device S3' may be electrically connected by the via plug 23. Each of the via plugs 12 and 23 may be a TSV. The insulating structure 25 of some example embodiments may be applied to the metal layer 29 for interconnection formed at ends of the via plugs 12 and 23.

According to some example embodiments, defects of a semiconductor device can be reduced by providing a via plug structure and a lower structure of an interconnection for improving electrical characteristics and reliability.

While some example embodiments have been described with reference to the accompanying drawings, it should be understood by those skilled in the art that various modifications may be made without departing from the scope of example embodiments and without changing essential features thereof. Therefore, the above-described embodiments should be considered in a descriptive sense only and not for purposes of limitation.

What is claimed is:

1. A semiconductor device comprising:
a via plug on a substrate;
a metal layer at an end of the via plug, the metal layer connected to an interconnection layer;
an insulating structure under and to a side of the metal layer; and
an upper insulating structure on the insulating structure, wherein,
the insulating structure includes a first top surface at a first height, a second top surface at a second height, and a side surface connecting the first top surface to the second top surface, and
the upper insulating structure includes a first bottom surface on the first top surface of the insulating structure, a side surface adjacent to the side surface of the insulating structure, and a second bottom surface on the second top surface of the insulating structure.

2. The semiconductor device of claim 1, wherein the insulating structure has a different thickness according to a distance from a circumference of the metal layer.

3. The semiconductor device of claim 1, wherein the insulating structure includes a different number of layers according to a distance from a circumference of the metal layer.

4. The semiconductor device of claim 3, wherein the insulating structure includes at least one of an etch stop layer and one or more insulating layers.

5. The semiconductor device of claim 3, wherein the insulating structure includes an increased number of layers as the distance from the circumference of the metal layer increases.

6. The semiconductor device of claim 3, wherein the insulating structure includes a decreasing number of layers as the distance from the circumference of the metal layer increases.

7. The semiconductor device of claim 3, wherein the insulating structure includes a fewer number of layers at a position spaced apart from the circumference of the metal layer than a position adjacent to the circumference of the metal layer.

8. The semiconductor device of claim 3, wherein the insulating structure includes an etch stop layer under the metal layer.

9. The semiconductor device of claim 1, further comprising:
a contact in the insulating structure, wherein
a first portion of the metal layer contacts the contact, and
a second portion of the metal layer contacts the via plug.

10. The semiconductor device of claim 9, wherein,
the first top surface of the insulating structure contacts a side surface of the first portion.

11. The semiconductor device of claim 10, wherein,
the insulating structure includes a plurality of layers including,
a first etch stop layer on the substrate, the first etch stop layer contacting the second portion of the metal layer and not contacting the first portion of the metal layer.

12. The semiconductor device of claim 11, wherein the insulating structure further includes,
an additional insulating layer on top of the first etch stop layer, wherein the additional insulating layer directly contacts the second portion of the metal layer and does not directly contact the first portion of the metal layer.

13. A semiconductor device comprising:
a semiconductor substrate;
an insulating structure on the semiconductor substrate;
a via plug at least partially passing through the semiconductor substrate and the insulating structure;
a metal layer at an end of the via plug; and
an upper insulating film on the insulating structure, wherein,
the insulating structure includes a first top surface at a first height, a second top surface at a second height, and a side surface connecting the first top surface to the second top surface, and
the upper insulating film includes a first bottom surface on the first top surface of the insulating structure, a side surface adjacent to the side surface of the insulating structure, and a second bottom surface on the second top surface of the insulating structure.

14. The semiconductor device of claim 13, wherein the metal layer inclines downwardly from a side surface of the metal layer.

15. The semiconductor device of claim 13, wherein the metal layer steps downward from an inside of a side surface of the metal layer.

16. The semiconductor device of claim 13, wherein the insulating structure is under a first lower surface of the metal layer.

17. The semiconductor device of claim 16, wherein a number of layers of the insulating structure outside the side surface of the metal layer is greater than a number of layers of the insulating structure under the first lower surface.

18. The semiconductor device of claim 16, wherein a number of layers of the insulating structure at a position spaced apart from the metal layer is less than a number of layers of the insulating structure under the first lower surface.

19. The semiconductor device of claim 16, wherein a number of layers of the insulating structure under the first lower surface is less than a number of layers of the insulating structure outside the side surface of the metal layer for interconnection, and is greater than a number of layers of the insulating structure at a position spaced apart from the metal layer.

20. A semiconductor device comprising:
a substrate;
a lower interlayer insulating film on the substrate;
a contact in the lower interlayer insulating film, the contact connected to the substrate;
a through via plug in the lower interlayer insulating film and in the substrate;
a metal layer including a first part on the contact and a second part on the through via plug;
a bottom insulating structure on the lower interlayer insulating film, the bottom insulating structure including (i) a first top surface at a first level, (ii) a second top surface at a second level, the second level higher than the first level, and (iii) a side surface connecting the first top surface to the second top surface; and
a top insulating structure on the bottom insulating structure, the top insulating structure including (i) a first bottom surface on the first top surface of the bottom insulating structure, (ii) a second bottom surface on the second top surface of the bottom insulating structure, and (iii) a side surface adjacent to the side surface of the top insulating structure, wherein
the first top surface, the side surface, and the second top surface form a step,
the first top surface of the bottom insulating structure contacts a side of the first part of the metal layer, and
the second top surface of the bottom insulating structure contacts a side of the second part of the metal layer.

* * * * *